United States Patent [19]

Yamatake

[11] Patent Number: 4,560,921
[45] Date of Patent: Dec. 24, 1985

[54] COMPARATOR CIRCUIT WITH BUILT IN REFERENCE

[75] Inventor: Mineo Yamatake, Cupertino, Calif.

[73] Assignee: National Semiconductor Corporation, Santa Clara, Calif.

[21] Appl. No.: 620,788

[22] Filed: Jun. 15, 1984

[51] Int. Cl.[4] .............................................. H03F 3/45
[52] U.S. Cl. .................................. 323/316; 307/362; 330/258
[58] Field of Search .............. 307/355, 362, 491, 492; 323/313, 314, 315, 316; 330/257, 258, 288

[56] References Cited

U.S. PATENT DOCUMENTS

| 4,319,181 | 3/1982 | Wrathall | 323/315 |
| 4,399,399 | 8/1983 | Joseph | 323/315 |
| 4,412,186 | 10/1983 | Nagano | 323/316 |

FOREIGN PATENT DOCUMENTS 2531208 2/1976 Fed. Rep. of Germany ...... 330/288

Primary Examiner—William H. Beha, Jr.
Assistant Examiner—Jeffrey Sterrett
Attorney, Agent, or Firm—Gail W. Woodward; Paul J. Winters; Michael J. Pollock

[57] ABSTRACT

A comparator circuit is disclosed wherein the input terminals are provided with a predetermined reference potential. Thus, in the case where only one input is driven the other input is biased at close to the reference. In the application of the circuit it is not necessary to provide an external package pin for reference potential.

10 Claims, 7 Drawing Figures

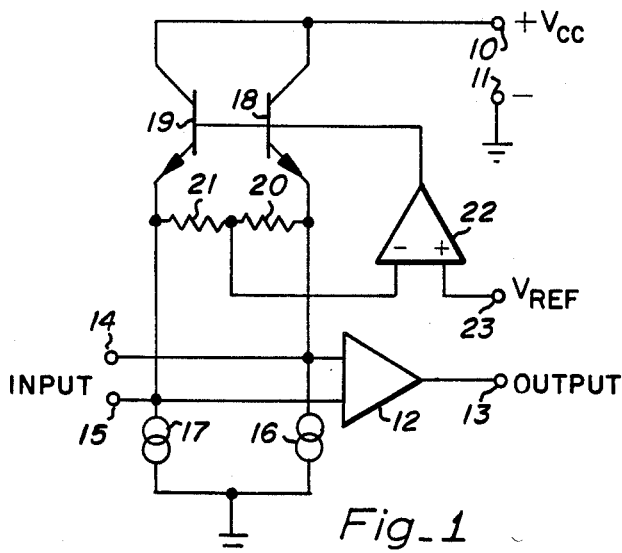
Fig_1
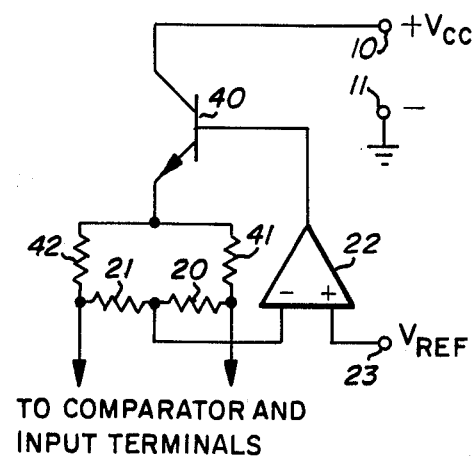
Fig_3
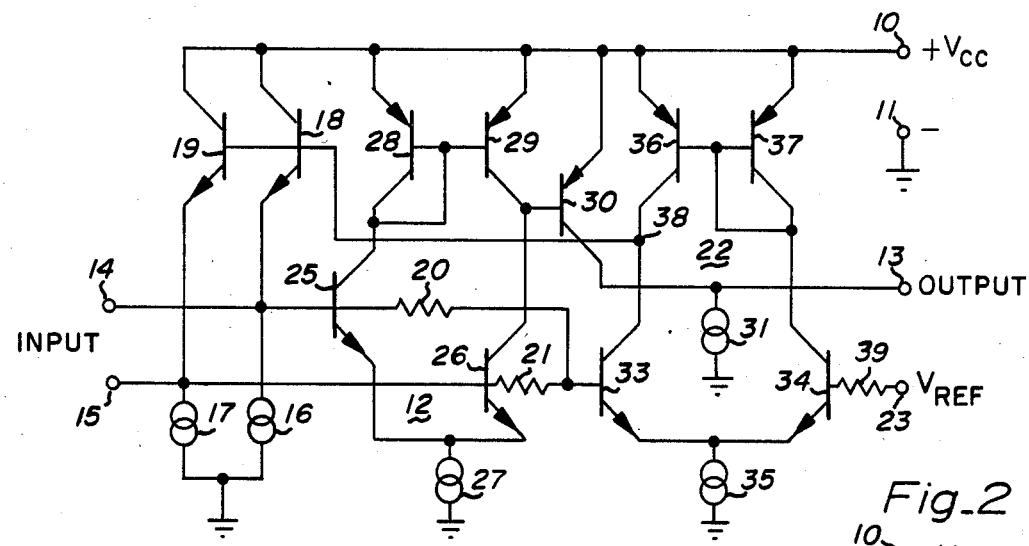
Fig_2
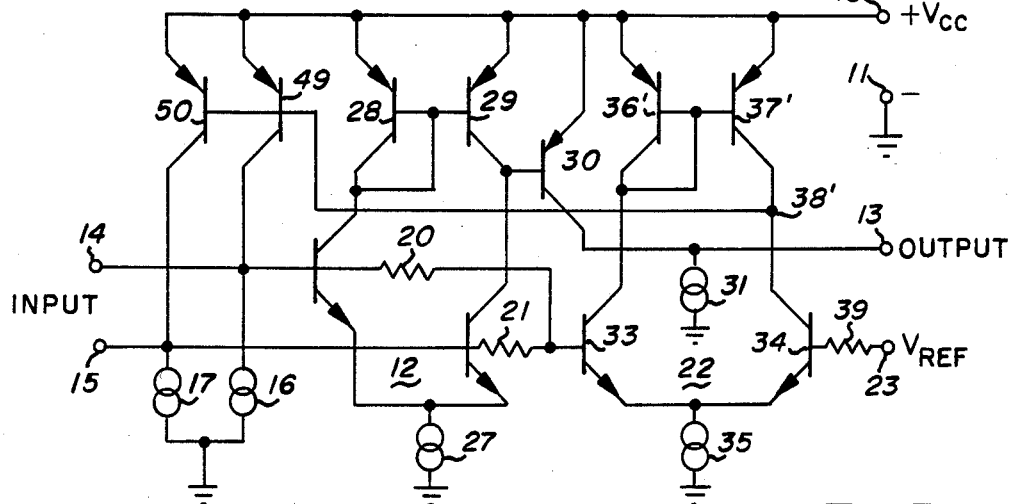
Fig_7

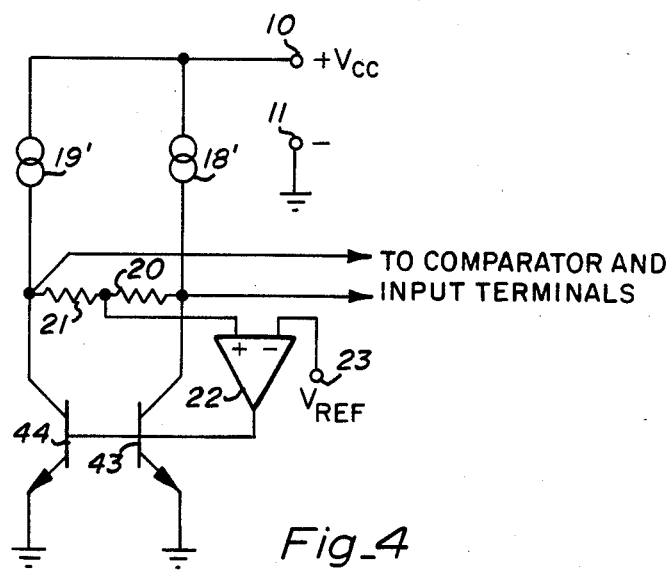
Fig_4
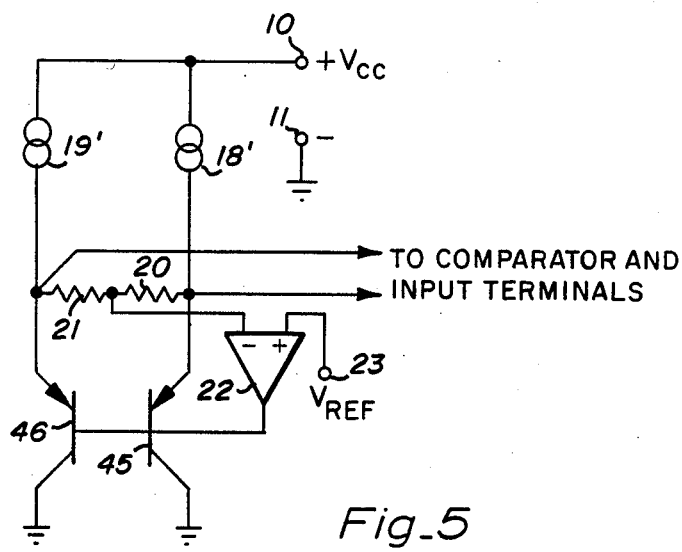
Fig_5
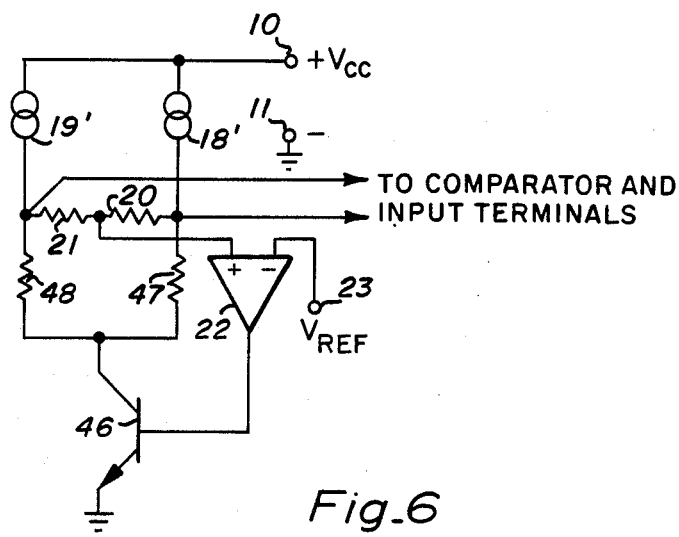
Fig_6

COMPARATOR CIRCUIT WITH BUILT IN REFERENCE

BACKGROUND OF THE INVENTION

The invention relates to a comparator circuit in which a reference potential is built in or imbedded. The comparator is primarily intended for use in switching voltage regulators but can be used in any application where a differential input terminal pair is required and an input reference is used in a voltage comparison function. In a switching regulator a number of terminals must be dedicated to circuit functions. For example, there must be supply and ground terminals along with a timing capacitor terminal. The control (or output) element requires emitter, collector and current limit terminals. Thus, six terminals are accounted for. If the comparator function is provided with inverting and noninverting inputs, eight terminals are required. If the device is to be housed in an eight-pin IC package there can be no provision for a separate reference potential terminal. It is highly desirable to make a switching regulator a universal device that can operate in the boost, buck and flyback modes and to house it in the most economical package available. This is the well known eight pin molded DIP. Since the flyback mode produces an inverted polarity output, the comparator must be capable of accepting inverted as well as standard inputs. This means that no reference pin is available. In some commercial regulators the comparator has only one input pin available. For these devices to be operated in the flyback mode another IC in the form of a unity gain inverter must be added to and coupled into the circuit.

SUMMARY OF THE INVENTION

It is an object of the invention to imbed a reference potential into the input portion of a comparator circuit so that both inputs will operate at a reference voltage when no input current flows.

It is a further object of the invention to construct a comparator circuit in which the signal input terminals are provided with a reference potential so that the circuit can be packaged without requiring a reference pin.

These and other objects are achieved by adding a bias circuit to a conventional differential comparator circuit. Each of the signal input terminals is provided with a current source and a current sink. One pair (sources or sinks) is controlled so as to provide a predetermined bias voltage level. The control is achieved using a control operational amplifier which has one input coupled to a source of reference potential. The other input is coupled equally to both of the signal input terminals so as to respond to the common mode voltage. The operational amplifier output is used to drive either the current sources or current sinks so that the common mode potential equals the desired reference potential. The result is that the internally developed reference voltage is applied to both signal input terminals thereby eliminating the need for a voltage reference pin. Regardless of which input is driven, the other input is forced to a level where the common mode potential is at the reference potential.

BRIEF DESCRIPTION OF THE DRAWING

FIG. 1 is a combined schematic and blockdiagram showing the basic elements of the invention.

FIG. 2 is a schematic diagram of a circuit suitable for an IC embodiment of the invention.

FIG. 3, 4, 5 and 6 show alternate embodiments of the input circuit of FIGS. 1 and 2.

FIG. 7 is a complete schematic diagram of still another alternative embodiment of the invention.

DESCRIPTION OF THE INVENTION

In the circuit of FIG. 1 a $V_{CC}$ power supply is connected between + terminal 10 and —(or ground) terminal 11. The circuits to be shown herein are intended primarily for use in conventional silicon pn junction isolated monolithic IC form. However, it is to be understood that the invention applies to discrete or other circuit construction forms.

The heart of the circuit is comparator 12 which has an output terminal 13 and differential input terminals 14 and 15. A matched pair of current sinks 16 and 17 are respectively connected between input terminals 14 and 15 and ground. Matched NPN transistors 18 and 19 respectively act as controlled current sources coupled between $+V_{CC}$ and terminals 14 and 15. Resistors 20 and 21 are matched and respectively coupled from terminals 14 and 15 to the inverting input of control operational amplifier 22. The non-inverting input is coupled to $V_{REF}$ at terminal 23. Since resistors 20 and 21 are matched, the average input, or common mode voltage on terminals 14 and 15, is applied to the inverting input. Control operational amplifier 22 will force the conduction of transistors 18 and 19 to where the common mode voltage is equal to $V_{REF}$. In effect, current sinks 16 and 17 will pull terminals 14 and 15 low while transistors 18 and 19 will pull them high. When the source and sink conductions match, the $V_{REF}$ condition is achieved. It can be seen that comparator 12 will respond to the differential input to provide an output at terminal 13.

FIG. 2 is a schematic diagram showing one way of achieving the functions of FIG. 1. Where the parts are the same the same numerals are employed.

Comparator 12 is composed of differentially coupled transistors 25 and 26 with their tail current determined by current sink 27. Load transistors 28 and 29 form a current mirror that provides a single-ended drive to transistor 30 which acts as a common emitter amplifier that has current sink 31 acting as its load. Using this configuration makes terminal 14 the inverting input and terminal 15 the noninverting input.

Control operational amplifier 22 is composed of differentially coupled transistors 33 and 34 with their tail current established by current sink 35. Transistors 36 and 37 operate as a current mirror load to provide a single-ended output at node 38 which is directly coupled to the bases of transistors 18 and 19. In this configuration transistor 33 is the inverting input that is coupled to the juncture of resistors 20 and 21. Resistor 39 couples the noninverting input transistor 34 to $V_{REF}$ terminal 23. Control operational amplifier 22 will operate in its linear region to force the input terminals 14 and 15 to the $V_{REF}$ level. A convenient value of $V_{REF}$ is one volt which simplifies the resistor calculations in a voltage regulator application of the circuit. In operation, if terminal 15 is forced above terminal 14, output terminal 13 will be high. If terminal 15 is forced below terminal 14, output terminal 13 will be low.

FIG. 3 shows the schematic diagram of an alternative embodiment of the circuit in the current source #portion of the circuit. Here matched transistors 18 and 19 have been replaced with a single transistor 40 and a matched pair of resistors 41 and 42. Transistor 40 provides the total source current and resistors 41 and 42 split this current into the required two parts. Actually, in certain applications when external additional sink-current is used, there can be an excessive voltage drop across resistors 41 and 42. Accordingly, the circuit of FIGS. 1 and 2 is ordinarily preferred.

FIG. 4 shows an alternate embodiment in which the current sinks of FIGS. 1 and 2 are replaced with NPN transtors 43 and 44. In this case constant current sources 18' and 19' are fixed. Since transistors 43 and 44 will introduce a feedback phase inversion the juncture of resistors 20 and 21 is coupled to the noninverting input of control operational amplifier 22.

In FIG. 5, which is still another alternative embodiment, PNP transistors 45 and 46 act as controlled current sinks. Since there is no inversion in the current sink feedback, the juncture of resistors 20 and 21 is coupled to the inverting input of control operational amplifier 22.

FIG. 6 shows the current sink control version of the circuit of FIG. 3. Here control operational amplifier 22 drives the base of NPN transistor 46. Its sink current is split into two paths by matched resistors 47 and 48, which are coupled to the comparator input terminals.

FIG. 7 shows yet another alternative embodiment of the FIG. 2 showing in complete schematic form. In this circuit there are two differences. Transistors 17 and 18 of FIG. 2 have been replaced by matched PNP transistors 49 and 50. Control operational amplifier 22 is modified by reversing the roles of current mirror load transistors 36' and 37'. This locates output node 38' so that transistor 34 is the inverting input and transistor 33 is the noninverting input. Thus, the sense of control operational amplifier 22 is reversed to account for the inversion that will be introduced by transistors 49 and 50. This circuit embodiment is easier to drive from terminals 14 and 15 than that of FIG. 2. In FIG. 2 the input terminals look into the emitters of transistors 18 and 19 which act to present a low input impedance. In FIG. 7 the input terminals look into high impedance circuit nodes, The invention has been described and several alternative embodiments detailed. When a person skilled in the art reads the foregoing description, alternatives and equivalents within the spirit and intent of the invention will be apparent. For example, while a bipolar transistor design is shown, MOS or CMOS circuits could be employed. Accordingly, it is intended that the scope of the invention be limited only by the claims that follow.

I claim:

1. A comparator circuit having a pair of differential signal input terminals, a single-ended output and an input biasing circuit, said input bias circuit comprising: current sink means coupled to said signal input terminals;

current source means coupled to said signal input terminals; and means, responsive to the common mode potential at said signal input terminals, for controlling one of said current sink means and said current source means, to produce a reference bias at said signal input terminals.

2. The comparator circuit of claim 1 wherein said means for controlling comprise:

a control operational amplifier having a first input coupled to a reference potential, a second input coupled equally to said pair of differential signal input terminals, and an output coupled to control the conduction of one of said current sink means and said current source means.

3. The comparator of claim 2 wherein said current source means comprise a pair of transistors having their controlled conduction paths coupled to supply current to said signal input terminals and their control electrodes coupled to said output of said control operational amplifier.

4. The comparator of claim 2 wherein said current sink means comprise a pair of transistors having their controlled conduction paths coupled to sink current from said signal input terminals and their control electrodes coupled to said output of said control operational amplifier.

5. The comparator of claim 2 wherein said current source means comprise a pair of PNP transistors having their collectors coupled to said pair of differential signal input terminals and their bases coupled to said output terminal of said control operational amplifier.

6. The comparator of claim 2 wherein said current source means comprise a single NPN transistor having its emitter coupled to a matched pair of resistors which act to couple said emitter equally to said pair of differential signal input terminals, and its base coupled to said output terminal of said control operational amplifier.

7. The comparator of claim 2 wherein said current source means comprise a pair of NPN transistors having their collectors coupled to said pair of differential signal input terminals and their bases coupled to said output terminal of said control operational amplifier.

8. The comparator of claim 2 wherein said current sink means comprise a pair of NPN transistors having their collectors coupled to said pair of differential signal input terminals and their bases coupled to said output terminal of said control operational amplifier.

9. The comparator of claim 2 wherein said current sink means comprise a pair of PNP transistors having their emitters coupled to said pair of differential signal input terminals and their bases coupled to said output terminal of said control operational amplifier.

10. The comparator of claim 2 wherein said current sink means comprise a single NPN transistor having its collector coupled equally to said pair of differential signal input terminals, by way of a matched pair of resistors, and its base coupled to said output terminal of said control operational amplifier.

* * * * *